(12) United States Patent
Hossfeld

(10) Patent No.: US 8,289,597 B2
(45) Date of Patent: *Oct. 16, 2012

(54) APPARATUS FOR READING FROM AND/OR WRITING TO HOLOGRAPHIC STORAGE MEDIA

(75) Inventor: Wolfgang Hossfeld, Villingen-Schwenningen (DE)

(73) Assignee: Thomson Licensing, Boulogne-Billancourt (FR)

( * ) Notice: Subject to any disclaimer, the term of this patent is extended or adjusted under 35 U.S.C. 154(b) by 645 days.

This patent is subject to a terminal disclaimer.

(21) Appl. No.: 11/906,942

(22) Filed: Oct. 4, 2007

(65) Prior Publication Data

US 2008/0204835 A1 Aug. 28, 2008

(30) Foreign Application Priority Data

Oct. 13, 2006 (EP) .................................. 06122284

(51) Int. Cl.
*G03H 1/10* (2006.01)
(52) U.S. Cl. .............................. 359/10; 372/92; 369/103
(58) Field of Classification Search ................ 359/1–35; 372/92–108; 369/103
See application file for complete search history.

(56) References Cited

U.S. PATENT DOCUMENTS

| | | | | |
|---|---|---|---|---|
| 5,369,511 A * | 11/1994 | Amos | ............................... | 359/15 |
| 2002/0135832 A1 | 9/2002 | Edwards | | |
| 2003/0039001 A1 | 2/2003 | King et al. | | |
| 2007/0146838 A1 | 6/2007 | Toishi et al. | | |
| 2008/0007808 A1 | 1/2008 | Ogasawara et al. | | |

FOREIGN PATENT DOCUMENTS

| | | |
|---|---|---|
| CN | 1159046 A | 9/1997 |
| CN | 1534629 A | 10/2004 |
| EP | 1465163 A2 | 10/2004 |
| EP | 1 542 219 A2 | 6/2005 |
| EP | 01 624 451 A1 | 2/2006 |
| EP | 1 732 067 A | 12/2006 |
| JP | 2005293630 | 10/2005 |
| JP | 2005322387 | 11/2005 |
| WO | WO 2005/098829 A | 10/2005 |
| WO | WO2006064660 | 6/2006 |

OTHER PUBLICATIONS

Hideyeshi Hirimai et al: "Collinear holography" Applied Optics, OSA, Optical Society of America, Washington, DC, US, vol. 44, No. 13, May 1, 2005, pp. 2575-2579, XP007901854, ISSN: 00036935 the whole document.
Search report dated Mar. 14, 2007.

* cited by examiner

*Primary Examiner* — Jennifer L. Doak
(74) *Attorney, Agent, or Firm* — Tutunjian & Bitetto, P.C.

(57) ABSTRACT

The present invention relates to an apparatus for reading from and/or writing to holographic storage media, and more specifically to an apparatus for reading from and/or writing to holographic storage media having an improved overlap between one or more reference beams and an object beam or a reconstructed object beam. According to the invention, the apparatus has a common aperture arrangement of a reference beam and an object beam or a reconstructed object beam, wherein the focus of the reference beam is shifted relative to the focus of the object beam or the reconstructed object beam within a focal plane of the object beam or the reconstructed object beam inside or close to the holographic storage medium.

15 Claims, 8 Drawing Sheets

APPARATUS FOR READING FROM AND/OR WRITING TO HOLOGRAPHIC STORAGE MEDIA

This application claims the benefit, under 35 U.S.C. §119, of European Patent Application No. 06122284.0 on 13 Oct. 2006.

FIELD OF THE INVENTION

The present invention relates to an apparatus for reading from and/or writing to holographic storage media, and more specifically to an apparatus for reading from and/or writing to holographic storage media having an improved overlap between one or more reference beams and an object beam or a reconstructed object beam.

BACKGROUND OF THE INVENTION

In holographic data storage digital data are stored by recording the interference pattern produced by the superposition of two coherent laser beams, where one beam, the so-called 'object beam', is modulated by a spatial light modulator and carries the information to be recorded. The second beam serves as a reference beam. The interference pattern leads to modifications of specific properties of the storage material, which depend on the local intensity of the interference pattern. Reading of a recorded hologram is performed by illuminating the hologram with the reference beam using the same conditions as during recording. This results in the reconstruction of the recorded object beam.

One advantage of holographic data storage is an increased data capacity. Contrary to conventional optical storage media, the volume of the holographic storage medium is used for storing information, not just a few layers. One further advantage of holographic data storage is the possibility to store multiple data in the same volume, e.g. by changing the angle between the two beams or by using shift multiplexing, etc. Furthermore, instead of storing single bits, data are stored as data pages. Typically a data page consists of a matrix of light-dark-patterns, i.e. a two dimensional binary array or an array of grey values, which code multiple bits. This allows to achieve increased data rates in addition to the increased storage density. The data page is imprinted onto the object beam by the spatial light modulator (SLM) and detected with a detector array.

Currently mainly two solutions for holographic storage systems are discussed. In the collinear system, as disclosed for example in EP 1 624 451, separate parts of the objective lens aperture are used for the object beam and the reference beam, respectively. This system uses a kind of shift multiplexing as a multiplexing method. In the off-axis recording system, as disclosed for example in U.S. Pat. No. 6,721,076, the object beam and the reference beam do not share the same optical path. In this system angle and polytopic multiplexing are used.

For both solutions the overlapping of the reference beam and the object beam in the holographic storage medium is not optimal. This has the consequence that a significantly lower data density is obtained.

In holographic data storage the achievable capacity is strongly related to the so called M-number (M#) of the storage material. This number can be calculated as $M\# = M \cdot \sqrt{\eta}$. Here M denotes the number of holograms that can be multiplexed with a given diffraction efficiency $\eta$. This equation can only be applied when the overlap of the object beam and the reference beam is optimal. In practice, the overlap is always only partial. Thus a factor $L_{ol}$ has to be introduced, which describes the material consumption of the non-overlapping beams, so that $M\# = M\sqrt{\eta} \cdot L_{ol}$. The factor $L_{ol}$ is about 2 for collinear and off-axis recording. For further details see Curtis et al., "M/# requirements for Holographic Data Storage", Proceedings of the ODS conference 2006, pp. 9-11. In conclusion, a non-optimum overlap of the object beam and the reference beam in the holographic storage medium decreases the achievable capacity if a specific material and optical setup is given.

SUMMARY OF THE INVENTION

It is an object of the invention to propose a solution for improving the overlap of the object beam and the reference beam in an apparatus for writing to holographic storage media.

According to the invention, this object is achieved by an apparatus for reading from and/or writing to a holographic storage medium, with a coaxial arrangement of a reference beam and an object beam or a reconstructed object beam, wherein the focus of the reference beam is shifted relative to the focus of the object beam or the reconstructed object beam within a focal plane of the object beam or the reconstructed object beam inside or close to the holographic storage medium. The reference beam fills approximately the same aperture as the object beam, but is focused to a different point or region to allow a separation of the reconstructed object beam and the reference beam. The apparatus according to the invention in this way has an improved overlap of the reference beam and the object beam/reconstructed object beam within the holographic storage medium. This improved overlap allows to increase the data density.

Preferably, the apparatus has two or more reference beams or a ring shaped reference beam. Using two or more reference beams or a ring shaped reference beam has the advantage that a further improved overlap is achieved, especially if the reference beams are arranged symmetrically around the object beam/reconstructed object beam. The two or more reference beams or the ring shaped reference beam are advantageously generated by a diffractive element or a refractive element. Of course, also other types of elements may be used, e.g. reflective elements. Examples of a diffractive element are a linear or rotationally symmetric sinusoidal or binary grating, or a suitable holographic element. Diffractive elements have the advantage that in addition to generating multiple reference beams they also allow to influence the shape of the reference beams. Examples of a refractive element are a biprism or an inverted biprism, or a cone or an inverted cone. Of course, the cone or the inverted cone can also be approximated by a multi facet prism, i.e. the curved surface may be approximated by plane polygons. In this case the ring shaped reference beam is approximated by a plurality of reference beams, whose foci are located on a ring. Refractive elements have the advantage that they can be manufactured at low cost.

Advantageously, an aperture is provided for blocking the one or more reference beams. Such an aperture only pass the reconstructed object beam, whereas the one or more reference beams are blocked. Blocking of the reference beams ensures that they do not have any negative effect during data detection by the detector array. At the same time the aperture can be used for filtering the reconstructed object beam if a filtering is needed.

The apparatus is either adapted to read from and/or write to a transmission type holographic storage medium, or to a reflection type holographic storage medium. In case of a transmission type holographic storage medium the improved overlap of the object beam/reconstructed object beam and the one or more reference beams is easier to achieve than for a reflection type holographic storage medium. The reflection type holographic storage medium in turn has the advantage that a plurality of optical components are used for reading as well as for writing, i.e. the number of components is reduced. In this case, however, the diameters of the one or more reference beams and their tilting angles relative to the object beam or the reconstructed object beam are chosen such that the incoming one or more reference beams do not overlap with reflected reference beams within the holographic storage medium. This is achieved, for example, by using half cone shaped reference beams. Otherwise conjugate holograms could be produced in the holographic storage medium.

BRIEF DESCRIPTION OF THE DRAWINGS

For a better understanding the invention shall now be explained in more detail in the following description with reference to the figures. It is understood that the invention is not limited to this exemplary embodiment and that specified features can also expediently be combined and/or modified without departing from the scope of the present invention. In the figures.

DETAILED DESCRIPTION OF PREFERRED EMBODIMENTS

Figure 1:
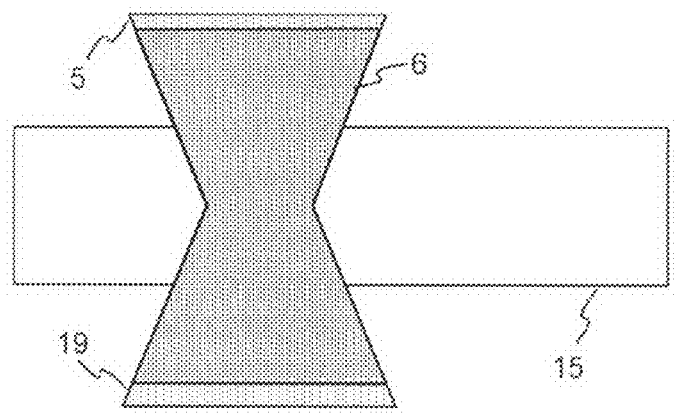
FIG. 1 illustrates an optimum overlap of an object beam and a reference beam inside a holographic storage medium.

As illustrated in FIG. 1, apparently an optimum overlap of an object beam 5 and a reference beam 6 is achieved if the reference beam 6 fills at least the same aperture as the object beam 5 inside the transmission type holographic storage medium 15, i.e. if it fills at least the same volume. This solution, however, has the disadvantage that during read-out it is not possible to separate a reconstructed object beam 19 and the reference beam 6. The object beam 5 is typically much weaker in intensity than the reference beam 6 in order to allow a high number of multiplexed holograms. This makes the read-out of the reconstructed object beam 19 much more difficult. The signal generated by the reference beam 6 is superimposed on the much weaker signal of the reconstructed object beam 19. In off-axis and collinear recording the reconstructed object beam 19 is automatically separated from the reference beam 6, as both beams 6, 19 propagate with different angles at the position of the image plane.

Figure 2:
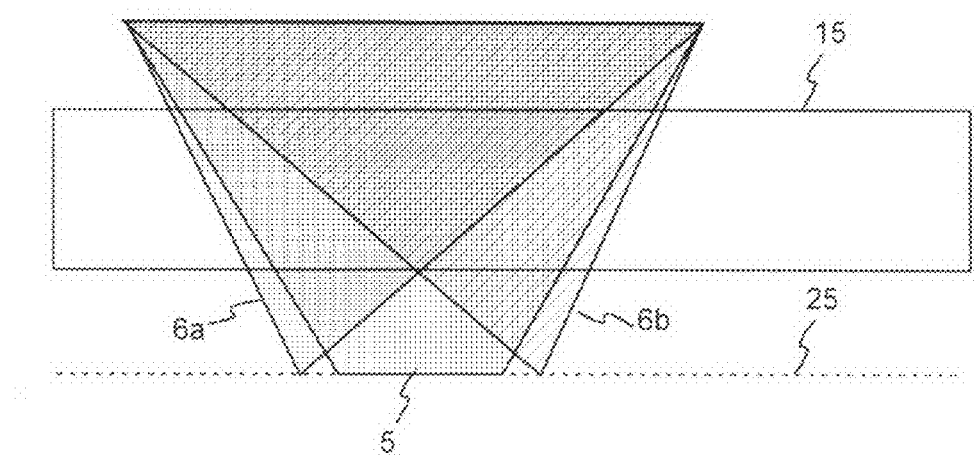
FIG. 2 depicts a nearly optimum overlap of an object beam and partial reference beams achieved by the solution according to the invention.

FIG. 2 schematically depicts how a nearly optimum overlap of an object beam 6 and partial reference beams 6 is achieved, according to the present invention, by shifting the focus of each reference beam 6 or the focus of each of a plurality of partial reference beams 6a, 6b relative to the focus of the object beam 5 within the focal plane 25 of the object beam 5. The beams 5, 6a, 6b are separated in the focal plane 25, while they still overlap very well in a region a little bit away from the focal plane 25. This region is sometimes called the "Fresnel region". The recordable volume of the holographic storage medium 15 preferably lies inside this region. The object beam 5 and the reference beams 6a, 6b can be separated during read-out by using an appropriate aperture or spatial filter at or near the focal plane of the object beam 5 and the reference beams 6a, 6b, which blocks the reference beams 6a, 6b. Contrary to the foci of the reference beams 6a, 6b the focus of the object beam 5 does not form a small spot, but an area. This is due to the fact that in a the object beam 5 coming from an SLM is not a plane wave, but a superposition of multiple plane waves having different propagation directions. Each of these plane waves has its focus at a different location of the focal plane 25.

Figure 3:
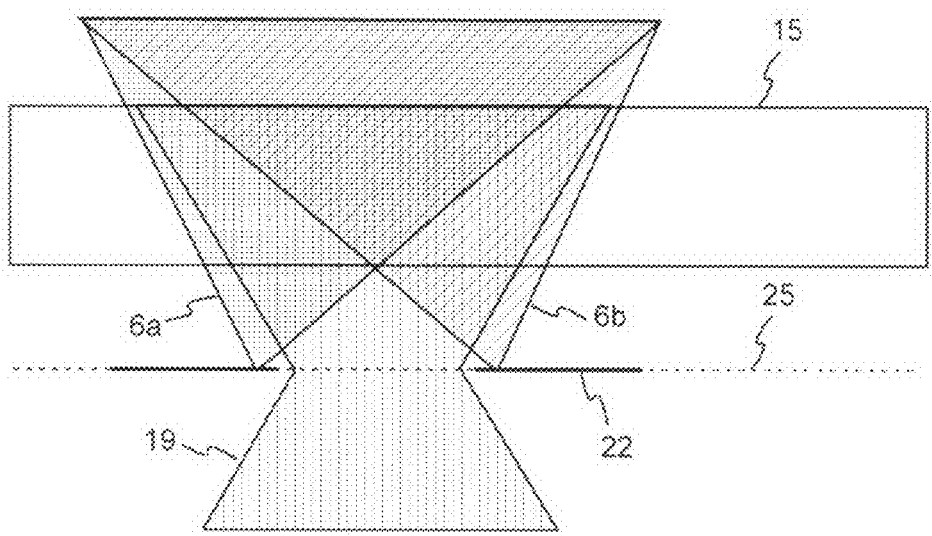
FIG. 3 illustrates an aperture for blocking the partial reference beams.

FIG. 3 shows an example of how the reference beams 6a, 6b are blocked during read-out by using an aperture 22 behind the holographic storage medium 15. According to the invention the recording is realized only in the Fresnel region, i.e. not in the direct vicinity of the focal region 25, there is a nearly full overlap of the object beam 5 and the reference beams 6a, 6b. Still, a reconstructed object beam 19 is reliably separated from the reference beams 6a, 6b.

Figure 4:
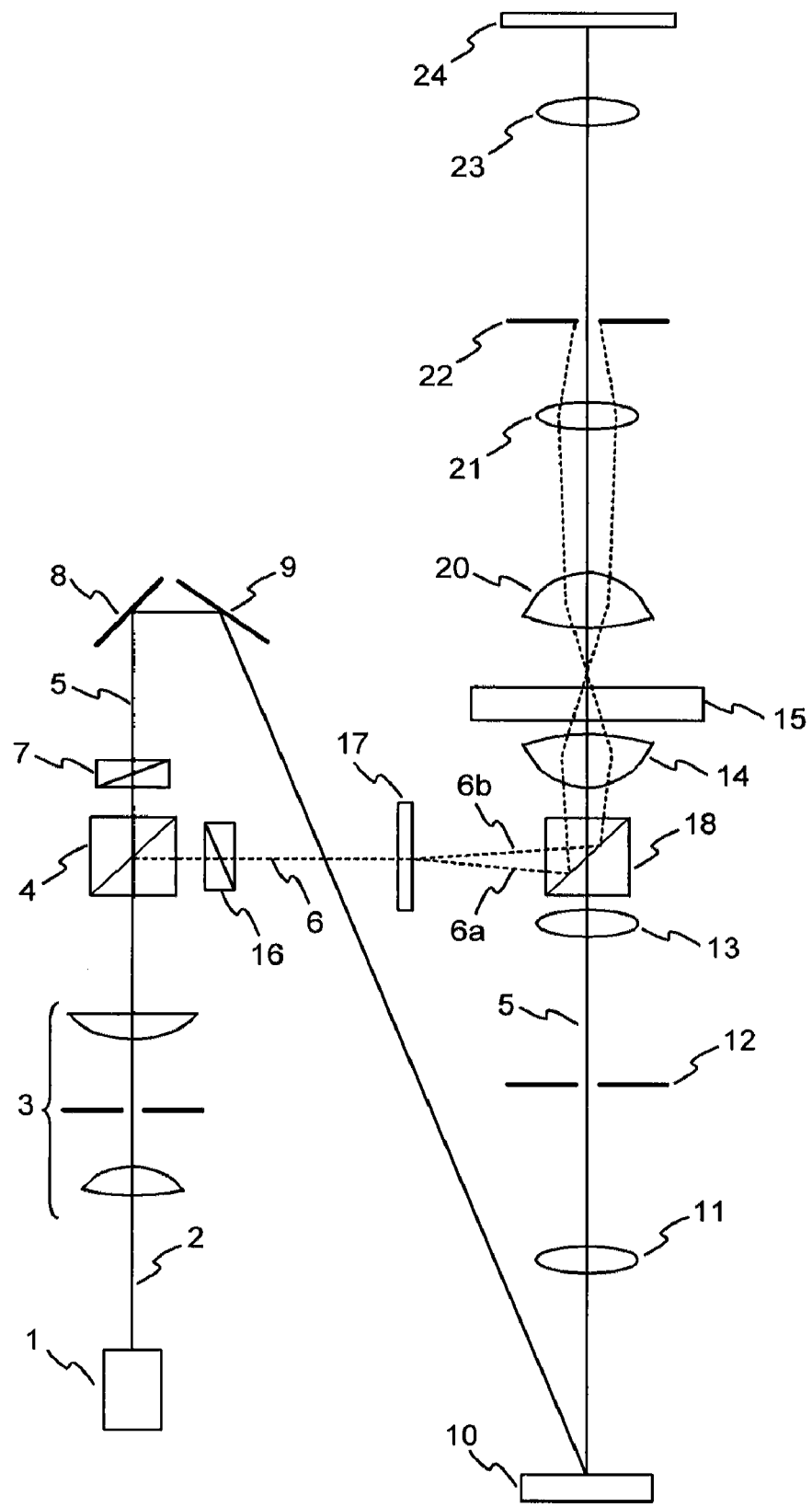
FIG. 4 shows a transmission type apparatus for reading from and writing to holographic storage media during the writing operation.

An exemplary setup of an apparatus for reading from and writing to holographic storage media is shown in FIG. 4. In contrast to FIGS. 1 to 3, for simplification only the principal rays of the light beams are illustrated. A source of coherent light, e.g. a laser diode 1, emits a light beam 2, which is collimated, expanded and filtered by a beam expander and filter arrangement 3. The light beam 2 is then divided into two separate light beams 5, 6 by a beam splitter 4. The first light beam 5, the so called "object beam", passes a beam shutter 7 and is directed by two mirrors 8, 9 towards a spatial light modulator (SLM) 10. The SLM 10 modulates the light beam 5 to imprint a 2-dimensional data pattern. The object beam 5 is filtered by a pair of Fourier lenses 11, 13 and a spatial filter 12, which filters out the high frequency components of the object beam 5. The object beam 5 is then focused into a holographic storage medium 15, e.g. a holographic disk or card, by an objective lens 14. The second light beam 6, the reference beam, also passes a beam shutter 16 before it impinges on a partial beam generating element 17, e.g. a bi-prism or a diffractive element. The partial beam generating element 17 generates two or more partial reference beams 6a, 6b from the reference beam 6. The partial beam generating element 17 is designed in such a way that the foci of the two partial reference beams 6a, 6b lie besides the focal area of the object beam 5. The partial reference beams 6a, 6b are coupled into the optical path of the object beam 5 by a beam coupling element 18, e.g. a beam splitter, and focused into the holographic storage medium 15 by the objective lens 14. At the intersection of the object beam 5 and the partial reference beams 6a, 6b an interference pattern appears, which is recorded in a photo-sensitive layer of the holographic storage medium 15.

Figure 5:
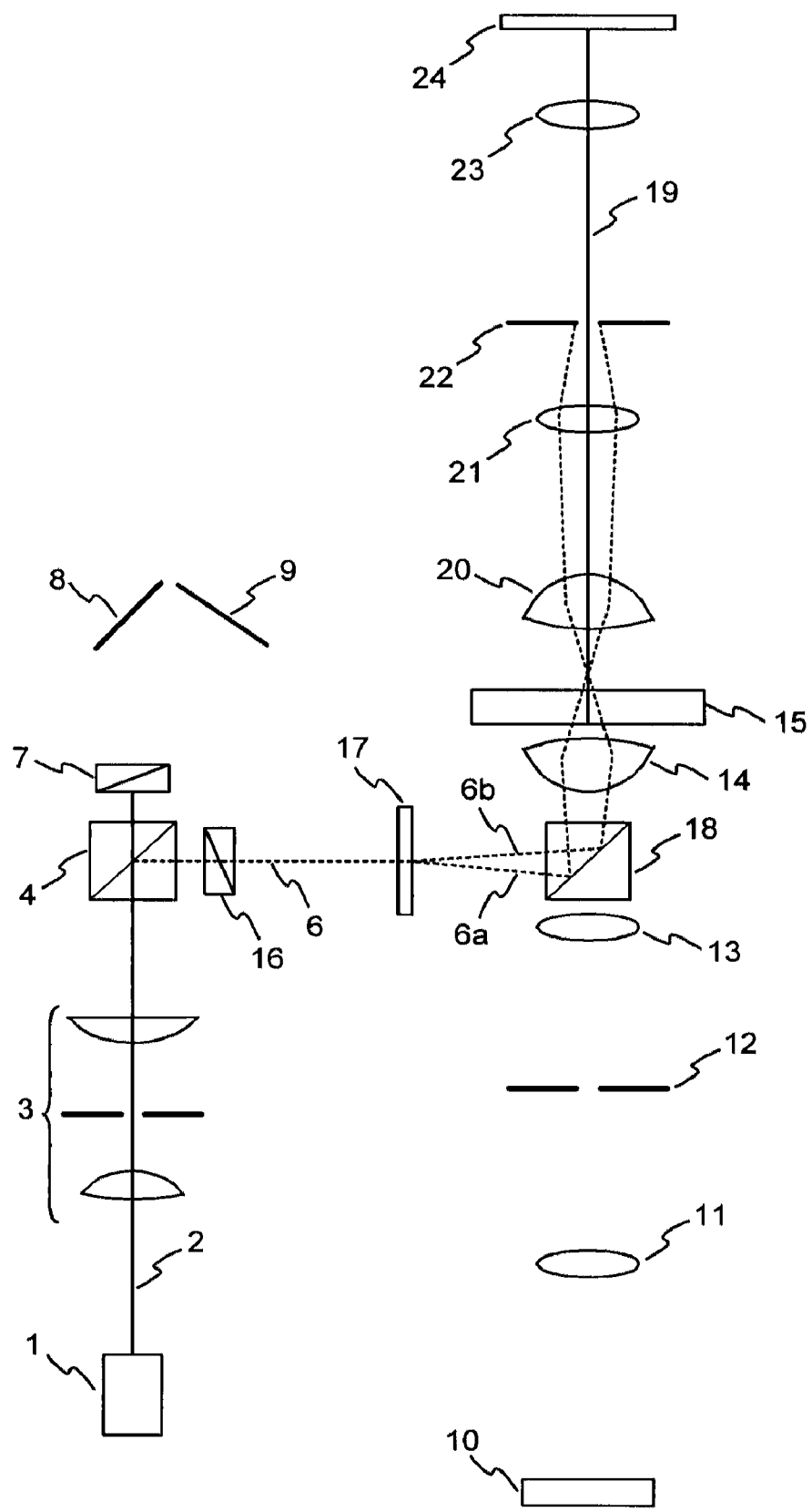
FIG. 5 shows the apparatus of FIG. 4 during the reading operation.

As shown in FIG. 5. the stored data are retrieved from the holographic storage medium 15 by illuminating a recorded hologram with the partial reference beams 6a, 6b only. For this purpose the object beam 5 is blocked by the beam shutter 7. The partial reference beams 6a, 6b are diffracted by the hologram structure and produce a copy of the original object beam 5, the reconstructed object beam 19. This reconstructed object beam 19 is collimated by an objective lens 20 and directed onto a 2-dimensional array detector 24, e.g. a CCD-array. A further pair of Fourier lenses 21, 23 and a further spatial filter 22 block the partial reference beams 6a, 6b. The spatial filter 22 is advantageously also used for filtering out the high frequency components of the reconstructed object beam 19. The array detector 24 allows to reconstruct the recorded data.

Of course, in an apparatus for writing only the elements of the reading path can be omitted. Similarly, in an apparatus for reading only the elements of the path of the object beam 5 can be omitted.

Figure 6:
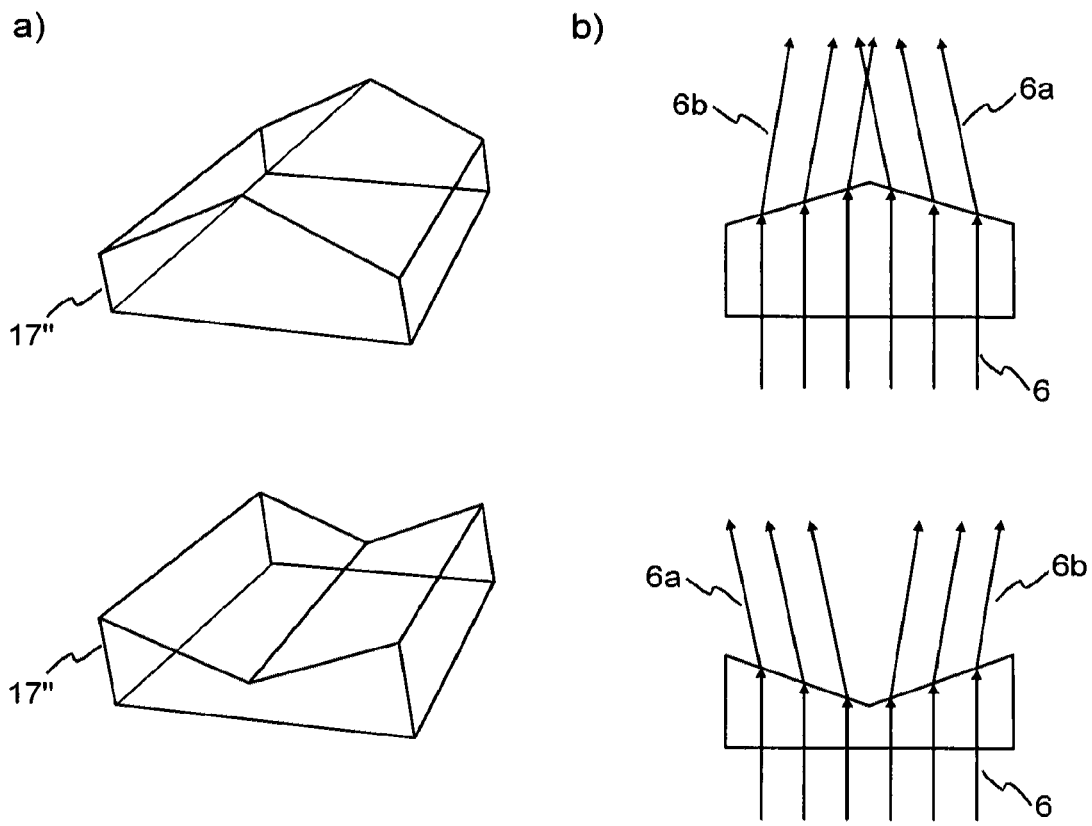
FIG. 6 shows a perspective view and a side view of two types of bi-prisms used as partial beam generating element.

The geometry of a bi-prism 17" as the partial beam generating element 17 is shown in FIG. 6. FIG. 6a) shows a 3-dimensional view of two different types of bi-prisms 17", whereas in FIG. 6b) cuts through the bi-prisms 17" are illustrated. As can be seen, the bi-prisms 17" divide the incoming reference beam 6 into two reference beams 6a, 6b having different propagation directions.

Figure 7:
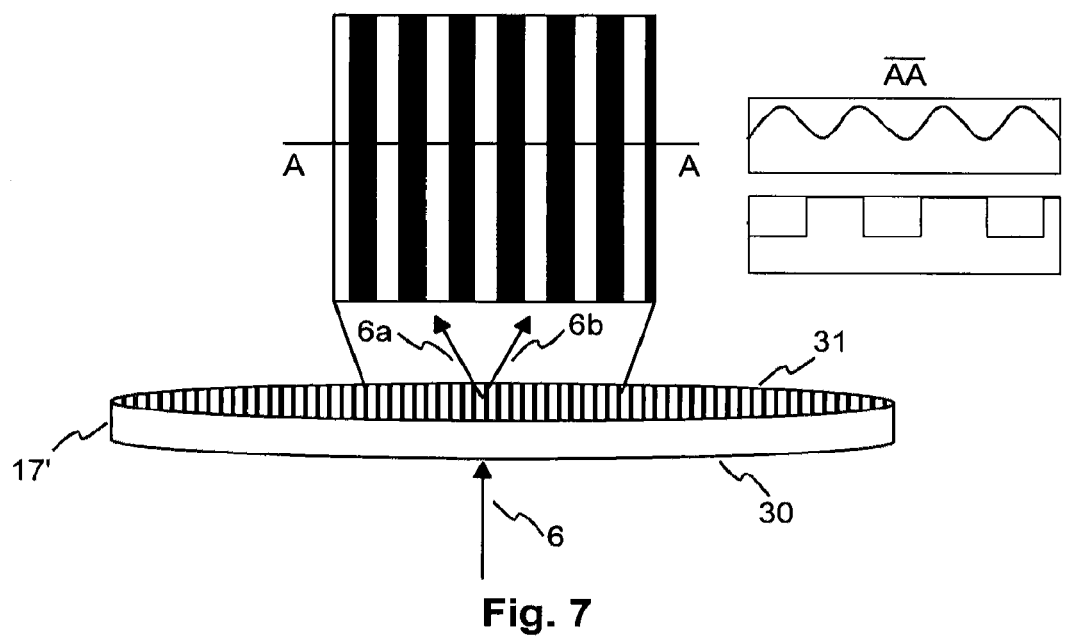
FIG. 7 illustrates a diffractive element used as partial beam generating element.

An exemplary form of a diffractive element 17' as the partial beam generating element 17 is shown in FIG. 7. In the bottom of the figure a perspective view of the element 17' is shown. Above this perspective view a magnified top view and a cut through the surface along a line $\overline{AA}$. In this example the diffractive element 17' is a transmissive diffraction grating. The beam entrance surface 30 of the element is plane, whereas the beam exit surface 31 of the element has a sinusoidal or a binary (two step) surface structure. If the depth of the grating is chosen to be approximately half of the wavelength of the laser light, then most of the incoming light 6 is diffracted into rays 6a, 6b that propagate at a certain angle relative to the optical axis. The angle and thus the position of the spot in the focal plane 25 can be controlled by choosing the appropriate grating period of the grating.

Figure 8:
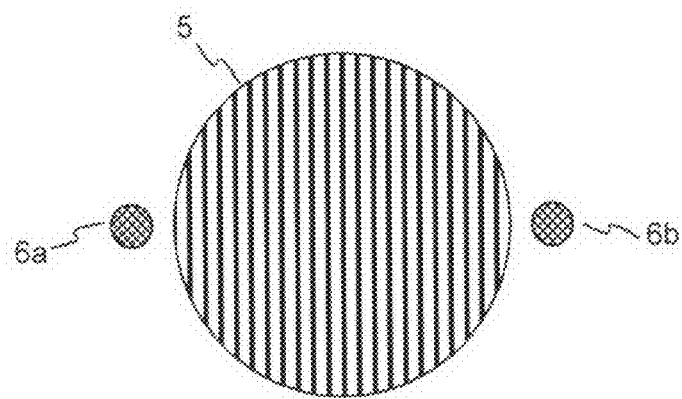
FIG. 8 depicts the distribution of the object beam and the partial reference beams in the focal plane of the reference beams.

FIG. 8 shows the distribution of the object beam 5 and the partial reference beams 6a, 6b as a top view onto the focal plane 25. The spots of the two reference beams lie beside the object beam 5.

Figure 9:
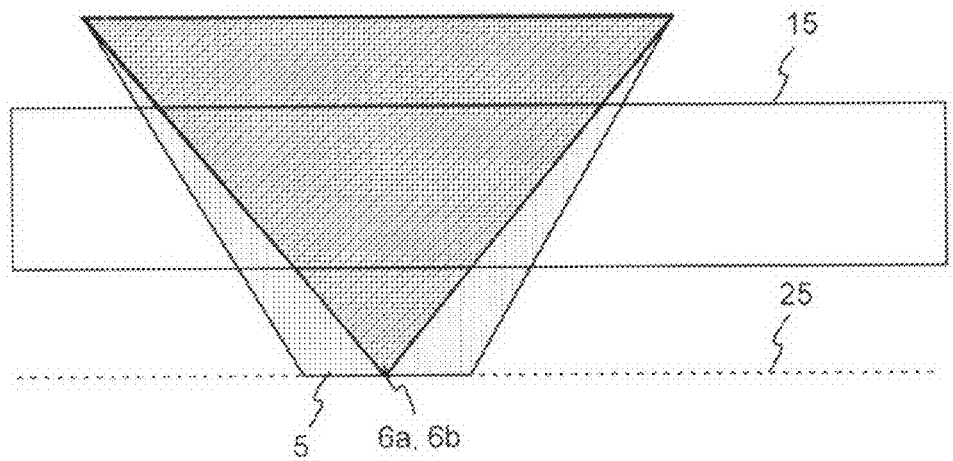
FIG. 9 illustrates the overlap of the object beam and the partial reference beams in a plane perpendicular to the plane defined by the partial reference beams.

In the above described solution the improved overlap is realized in the plane spanned by the optical axes of the two partial reference beams 6a, 6b. The overlap in a plane perpendicular to this plane is illustrated in FIG. 9.

Figure 10:
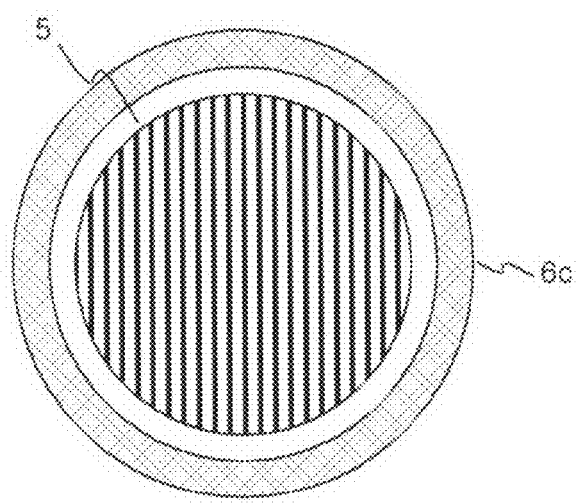
FIG. 10 depicts the distribution of the object beam and a ring type reference beam in the focal plane of the reference beam.

As a further improvement the bi-prism or the sinusoidal or binary grating is preferably substituted by an optical element which generates a focus ring 6c, instead of two spots in the focal plane 25. This is illustrated in FIG. 10. In this case the overlap is improved in the whole volume, because the overlap depicted in the plane shown in FIG. 2 is achieved for the whole hologram volume.

Figure 11:
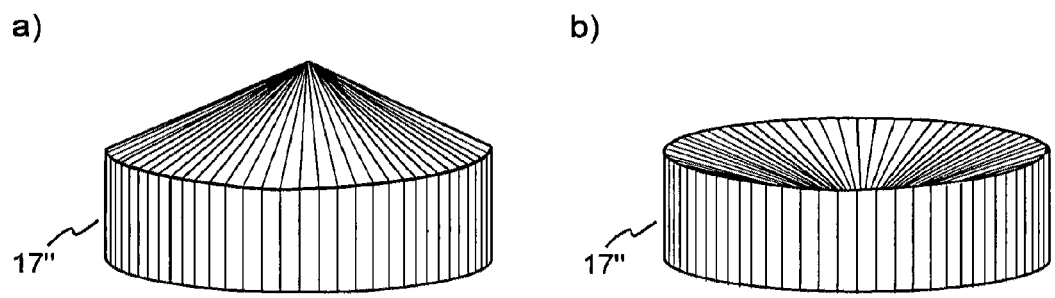
FIG. 11 illustrates two types of refractive elements used as partial beam generating element to obtain the ring type reference beam.

A 3-dimensional view of two different types of refractive optical element 17" as the partial beam generating element 17 is diagrammatically shown in FIG. 11. The refractive optical element 17" has the shape of a cone (FIG. 11a)) or an inverse cone (FIG. 11b)) with one plane side and one cone-shaped side, or an approximated shape of a cone or an inverse cone using a polygon approximation. In the latter case instead of a focal ring in the focal plane 25 multiple foci arranged on a ring are generated in the focal plane 25.

Figure 12:
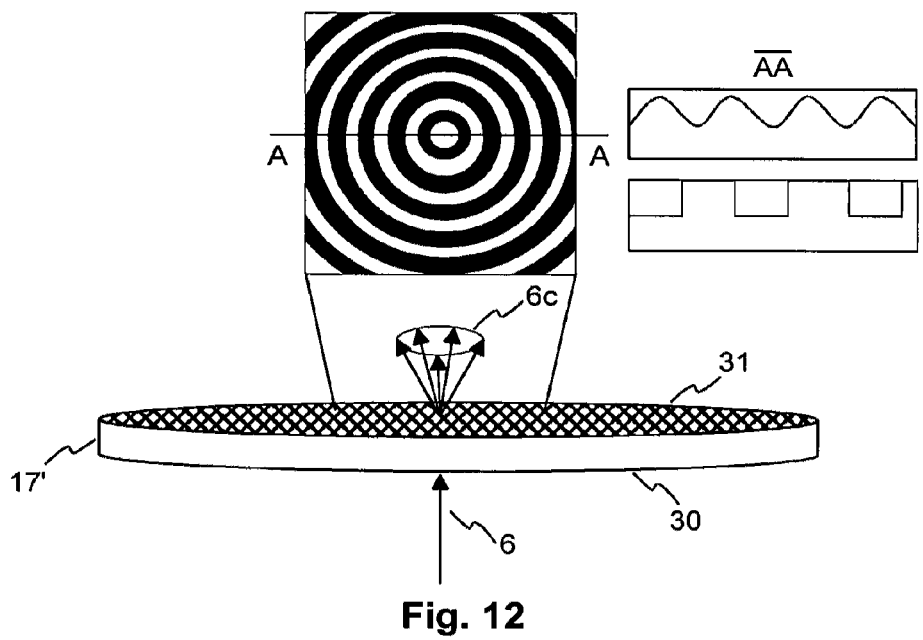
FIG. 12 illustrates a diffractive element used as partial beam generating element to obtain the ring type reference beam.

A diffractive optical element 17', which consists of a sinusoidal or binary surface grating 17' with a rotational symmetry, is illustrated in FIG. 12. The function principle is the same as for the linear sinusoidal or binary grating structure of FIG. 7. The only difference is that, due to the rotational symmetry of the element, the beams are diffracted in such a way that the propagation angle relative to the optical axis is the same for all partial beams.

Figure 13:
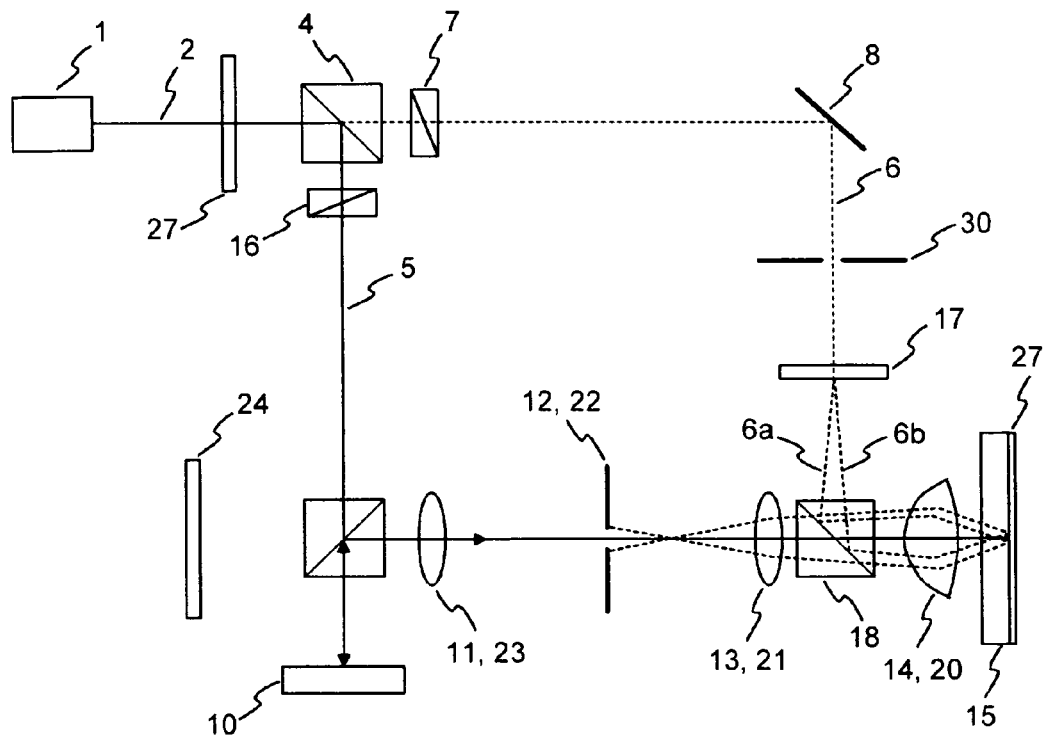
FIG. 13 shows a reflection type apparatus for reading from and writing to holographic storage media during the writing operation.
Figure 14:
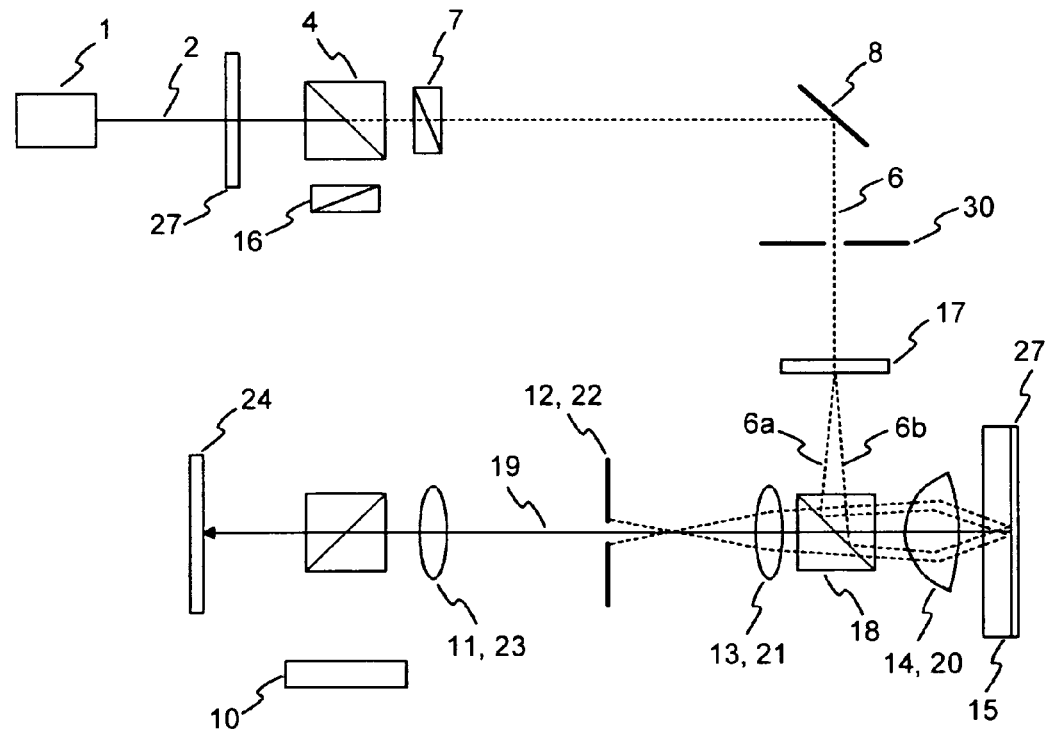
FIG. 14 shows the apparatus of FIG. 13 during the reading operation.
Figure 15:
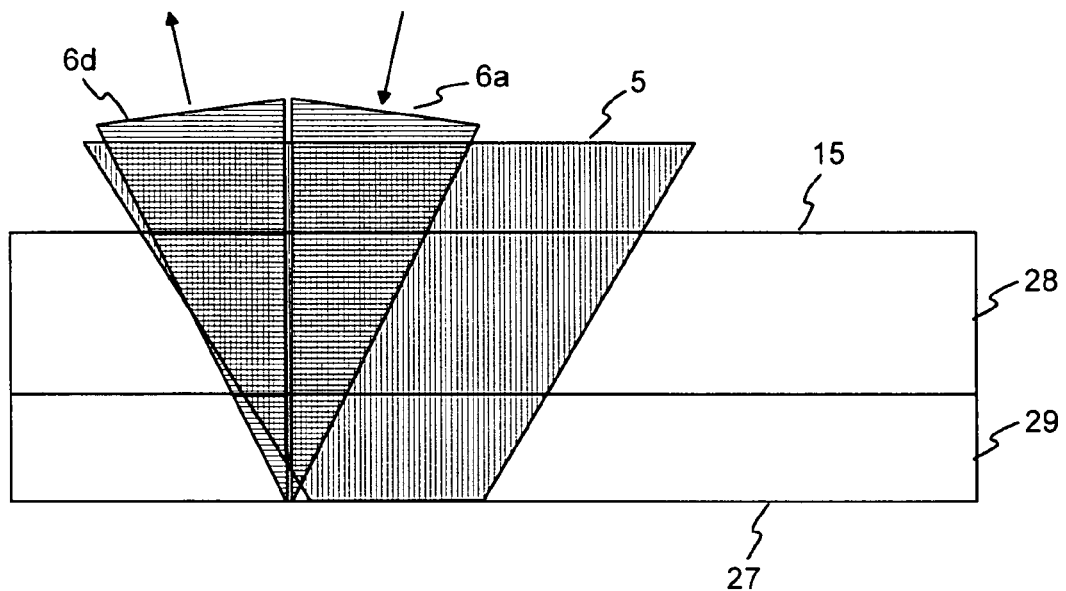
FIG. 15 illustrates the overlap of an object beam and an incoming and reflected reference beam in a reflection type medium, and FIG. 16 compares the situation of FIG. 15 with the situation in a transmission type medium.
Figure 16:
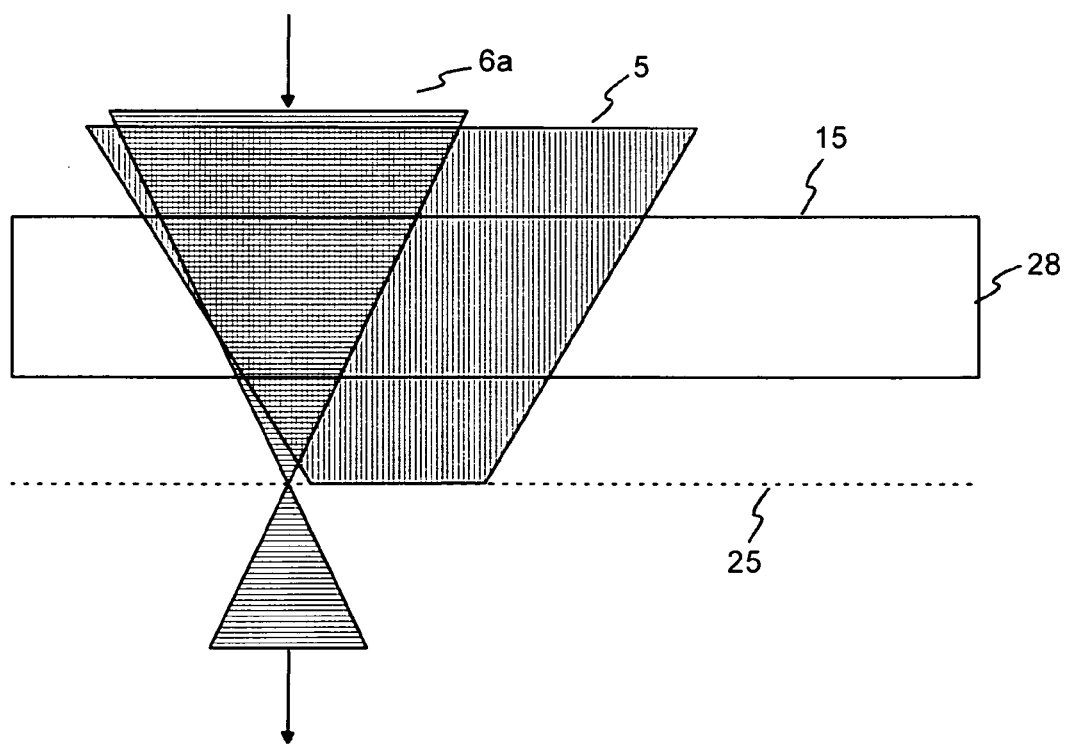

Though in the above description a transmission type holographic storage system has been explained, the idea is also applicable to reflection type holographic storage systems. Reflection type means that the data is recorded and read from only one side of the holographic storage medium 15. As a result some parts of the optical setup, for example the objective lens 14, can be used for both recording and reading of the data. This simplifies the setup and makes it more compact. An exemplary setup of a reflection type holographic storage system is shown in FIGS. 13 and 14 during recording and reading, respectively. In the figures the same reference signs as in FIGS. 4 and 5 are used to designate the same elements. The holographic storage medium 15 has a reflective layer 27 behind the storage layer such that during reading a reconstructed object beam 19 is reflected back to the objective lens 14. The main difference compared to the transmission type system is that only half or less of the aperture of the objective lens 14 is illuminated by the incoming reference beams 6a, 6b to avoid the recording of conjugated holograms. This is preferably controlled by an additional aperture 30 positioned in front of the partial beam generating element 17 which generates the reference beams 6a, 6b. The illuminated aperture of the incoming reference beams is chosen such that there is no overlap of the incoming and the reflected reference beams. This principle is illustrated in FIG. 15. For simplification only one reference beam 6a is shown. Favorably, more than one reference beam is used to achieve a good overlap of the object beam 5 and the reference beams 6a, 6b. As can be seen, the reflective layer 27 is located in the focal plane below the hologram storage layer 28. In the figure the hologram storage layer 28 is separated from the reflective layer 27 by a spacer layer 29. For comparison FIG. 16 shows the same situation for the transmission type holographic storage medium 15. It can be seen that for a reflection type holographic storage medium 15 the incoming reference beam 6a and the reflected reference beam 6d have to fill the same aperture as the incoming reference beam 6a for the transmission type medium 15. This is preferably realized by a higher tilt of the incoming reference beam 6a towards the optical axis. The diameter of the reference beams 6a, 6b and their tilting angles are chosen such that the incoming reference beams 6a, 6b and the reflected reference beams 6d do not overlap, e.g. by using half cone reference beams 6a, 6b.

What is claimed is:

1. An apparatus for reading from a holographic storage medium, with a coaxial arrangement of a reference beam and a reconstructed object beam, the apparatus comprising:
   a light source for generating the reference beam; and
   an objective lens for focusing the reference beam and for illuminating the focused reference beam onto a hologram recorded in the holographic storage medium,
      wherein the reconstructed object beam and the reference beam partially or fully overlap in an object plane of the objective lens,
      and wherein a focus of the reference beam is displaced relative to a focus of the reconstructed object beam within a focal plane of the reconstructed object beam perpendicular to an optical axis of the reconstructed object beam such that the reference beam and the reconstructed object beam are spatially separated in the focal plane of the reconstructed object beam.

2. The apparatus according to claim 1, wherein the apparatus comprises two or more reference beams or a ring shaped reference beam.

3. The apparatus according to claim 2, wherein the apparatus comprises a diffractive element or a refractive element for generating the two or more reference beams or the ring shaped reference beam.

4. The apparatus according to claim 3, wherein the diffractive element is a linear or rotationally symmetric sinusoidal or binary grating.

5. The apparatus according to claim 3, wherein the refractive element is a biprism or an inverted biprism, or a cone or an inverted cone.

6. Apparatus according to claim 1, further having an aperture for blocking the one or more reference beams.

7. Apparatus according to claim 1, wherein it is adapted to read from and/or write to a transmission type holographic storage medium.

8. Apparatus according to claim 1, wherein it is adapted to read from and/or write to a reflection type holographic storage medium.

9. Apparatus according to claim 8, wherein the diameters of the one or more reference beams and their tilting angles relative to the object beam or the reconstructed object beam are such that the incoming one or more reference beams do not overlap with reflected reference beams within the holographic storage medium.

10. Apparatus according to claim 1, wherein a storage layer of the holographic storage medium is located in the Fresnel region of the focal region of the reference beam.

11. An apparatus for writing to a holographic storage medium, with a coaxial arrangement of a reference beam and an object beam, the apparatus comprising:
   a light source for generating the reference beam and the object beam; and
   an objective lens for focusing the reference beam and the object beam and for illuminating the focused reference beam and the focused object beam into a photo-sensitive layer of the holographic storage medium,
      wherein the object beam and the reference beam partially or fully overlapping in an object plane of the objective lens,
      and wherein a focus of the reference beam is displaced relative to a focus of the object beam within a focal plane of the object beam perpendicular to an optical axis of the object beam such that the reference beam and the object beam are spatially separated in the focal plane of the object beam.

12. The apparatus according to claim 11, wherein the apparatus comprises two or more reference beams or a ring shaped reference beam.

13. The apparatus according to claim 12, wherein the apparatus comprises a diffractive element or a refractive element for generating the two or more reference beams or the ring shaped reference beam.

14. The apparatus according to claim 13, wherein the diffractive element is a linear or rotationally symmetric sinusoidal or binary grating.

15. The apparatus according to claim 13, wherein the refractive element is a biprism or an inverted biprism, or a cone or an inverted cone.

* * * * *